(12) United States Patent
Emori et al.

(10) Patent No.: US 12,207,434 B2
(45) Date of Patent: Jan. 21, 2025

(54) COOLING DEVICE

(71) Applicants: NISSAN MOTOR CO., LTD., Yokohama (JP); RENAULT s.a.s., Boulogne-Billancourt (FR)

(72) Inventors: Kenta Emori, Kanagawa (JP); Jumpei Niida, Kanagawa (JP); Emi Takahashi, Kanagawa (JP); Shigeharu Yamagami, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 18/577,130

(22) PCT Filed: Jul. 8, 2021

(86) PCT No.: PCT/IB2021/000456
§ 371 (c)(1),
(2) Date: Jan. 5, 2024

(87) PCT Pub. No.: WO2023/281286
PCT Pub. Date: Jan. 12, 2023

(65) Prior Publication Data
US 2024/0268058 A1    Aug. 8, 2024

(51) Int. Cl.
*H05K 7/20* (2006.01)
*H01L 23/467* (2006.01)
*H05H 1/24* (2006.01)
*H05K 1/16* (2006.01)

(52) U.S. Cl.
CPC ....... *H05K 7/20136* (2013.01); *H01L 23/467* (2013.01); *H05H 1/2439* (2021.05); *H05K 1/16* (2013.01)

(58) Field of Classification Search
CPC ...... H05K 7/20136–20145; H05K 1/16; H01L 23/467; H05H 1/2439
See application file for complete search history.

(56) References Cited

U.S. PATENT DOCUMENTS

| | | | | |
|---|---|---|---|---|
| 7,999,173 | B1 * | 8/2011 | Ashpis | H02S 40/10 136/251 |
| 10,842,013 | B2 * | 11/2020 | Sato | H05H 1/2437 |
| 11,484,859 | B2 * | 11/2022 | Watanabe | C09J 183/08 |
| 11,839,049 | B2 * | 12/2023 | Emori | H05K 7/20136 |

(Continued)

FOREIGN PATENT DOCUMENTS

| | | |
|---|---|---|
| CN | 102823090 A | 12/2012 |
| JP | 2007294180 A * | 11/2007 |

(Continued)

*Primary Examiner* — Robert J Hoffberg
(74) *Attorney, Agent, or Firm* — Foley & Lardner LLP

(57) ABSTRACT

A cooling device cools an electronic component using a plasma actuator provided with a dielectric, a first electrode arranged on one surface of the dielectric to generate an induced flow, and a second electrode arranged on the other surface of the dielectric, in which the electronic component and a third electrode are arranged in a flow direction of the induced flow, and a voltage applied to the third electrode is a voltage that generates a potential difference, which is capable of attracting the induced flow, between the first electrode and the third electrode.

17 Claims, 10 Drawing Sheets

(56) References Cited

U.S. PATENT DOCUMENTS

| | | |
|---|---|---|
| 2010/0224733 A1 | 9/2010 | Wood et al. |
| 2011/0149461 A1 | 6/2011 | MacDonald et al. |
| 2012/0268857 A1 | 10/2012 | Jewell-Larsen |
| 2013/0064710 A1* | 3/2013 | Jacob ............... H01J 37/32 422/186.21 |
| 2013/0083446 A1 | 4/2013 | Yagi et al. |
| 2019/0193863 A1* | 6/2019 | Abdollahzadehsangroudi ............ B64D 15/20 |

FOREIGN PATENT DOCUMENTS

| | | | | |
|---|---|---|---|---|
| JP | 5481567 B2 | | 4/2014 | |
| JP | 2017-117950 A | | 6/2017 | |
| JP | 2020-057720 A | | 4/2020 | |
| JP | 2023018985 A | * | 2/2023 | |
| WO | WO-9412282 A1 | * | 6/1994 | ............ H01L 23/34 |
| WO | WO-2012/081704 A1 | | 6/2012 | |
| WO | WO-2018216767 A1 | * | 11/2018 | ............ B01J 19/08 |
| WO | WO-2020070533 A1 | * | 4/2020 | ............ F28D 1/024 |

\* cited by examiner

COOLING DEVICE

TECHNICAL FIELD

The present embodiment relates to a cooling device using a plasma actuator.

BACKGROUND ART

Patent Literature 1 discloses a prior known electronic device for cooling a substrate in a housing such as a shield case and elements on the substrate. In the electronic device disclosed in Patent Literature 1, airflow discharged from a cooling fan is diagonally applied to an upper wall plate to change the direction and made to flow in the direction of the main substrate, thereby cooling the elements on the main substrate.

CITATION LIST

Patent Literature

Patent Literature 1: JP2017-117950A

SUMMARY OF THE INVENTION

Technical Problem

However, in the prior known electronic device described above, since the airflow discharged from the cooling fan is applied to the wall of the shield case to change the direction, not all the airflow that is applied to the wall is made to flow in the direction of the electronic components on the substrate, but diffuses into the shield case. For this reason, there is a problem that the cooling performance cannot be improved because the airflow cannot be applied to the electronic components efficiently.

Accordingly, the present invention has been made in view of the above circumstances, and an object of the present invention is to provide a cooling device capable of improving a cooling performance by efficiently applying an airflow to electronic components.

Solution to Problem

In order to solve the above problem, a cooling device according to an aspect of the present invention cools an electronic component using a plasma actuator. The plasma actuator is provided with a dielectric, a first electrode arranged on one surface of the dielectric to generate an induced flow, and a second electrode arranged on the other surface of the dielectric. The electronic component and a third electrode are arranged in a flow direction of the induced flow, and a voltage applied to the third electrode is a voltage that generates a potential difference, which is capable of attracting the induced flow, between the first electrode and the third electrode.

Advantageous Effects

The present embodiment makes it possible to efficiently apply an airflow to electronic components, thereby improving a cooling performance of a cooling device.

DESCRIPTION OF EMBODIMENTS

First Embodiment

Figure 1:
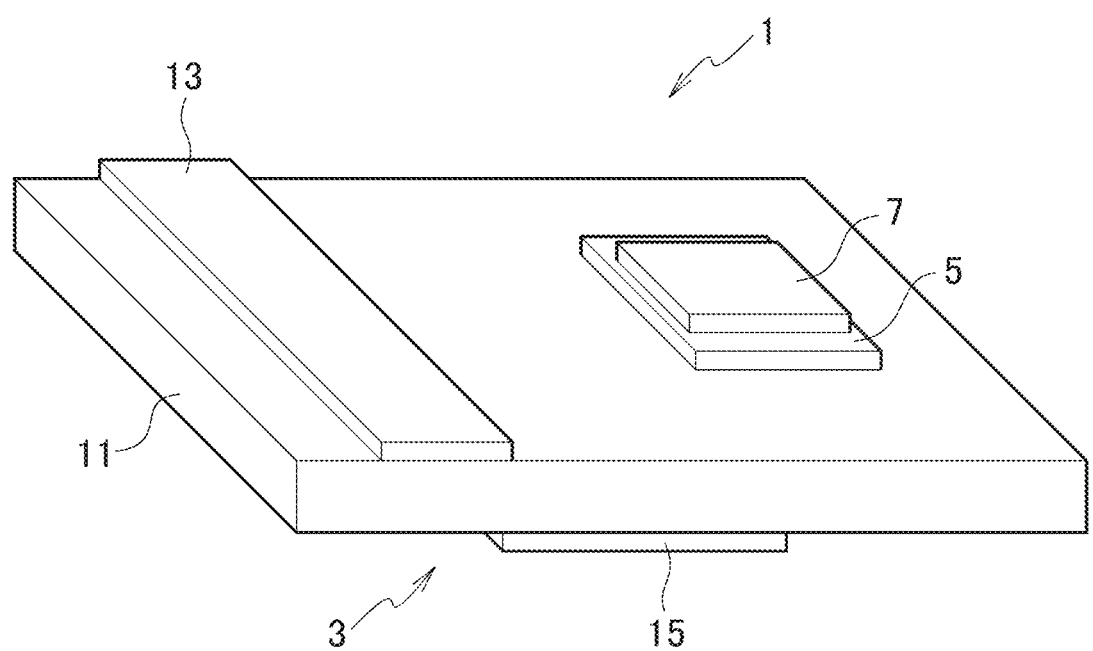
FIG. 1 is a perspective view illustrating a configuration of a cooling device according to a first embodiment of the present invention.

A first embodiment of the present invention will be described below with reference to the drawings. The same elements illustrated in the drawings are denoted by the same reference numerals, and overlapping descriptions are not repeated below.

Configuration of Cooling Device

Figure 2:
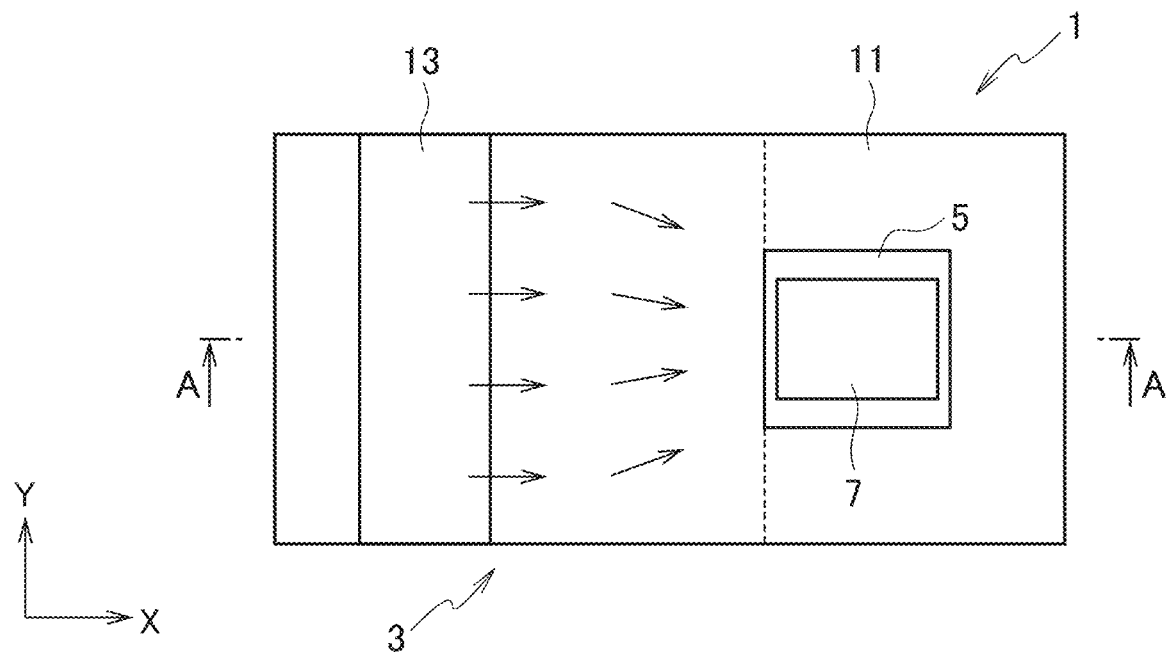
FIG. 2 is a top view illustrating the configuration of the cooling device according to the first embodiment of the present invention.
Figure 3:
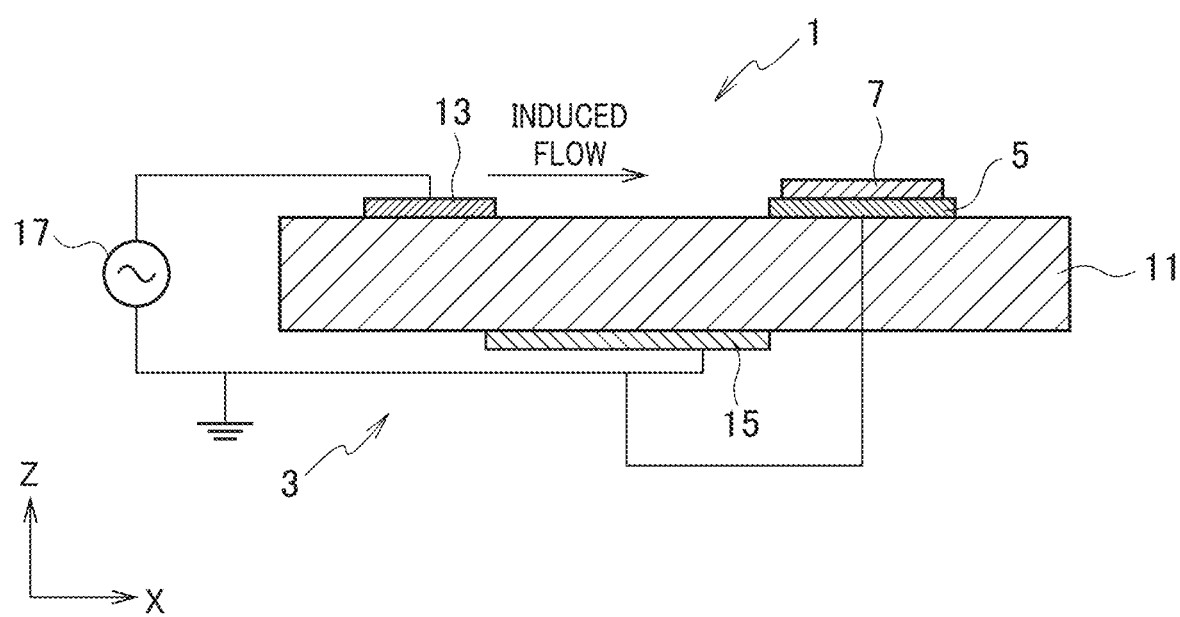
FIG. 3 is a cross-sectional view illustrating the configuration of the cooling device according to a first embodiment of the present invention.

FIG. 1 is a perspective view illustrating a configuration of a cooling device according to the present embodiment, FIG. 2 is a top view thereof, and FIG. 3 is a cross-sectional view thereof along the line A-A of FIG. 2. As illustrated in FIGS. 1 to 3, a cooling device 1 includes a plasma actuator 3, a control electrode (third electrode) 5, and an electronic component 7.

The plasma actuator 3 includes a dielectric 11, an upper electrode (first electrode) 13 arranged on the upper surface of the dielectric 11 to generate an induced flow, a lower electrode (second electrode) 15 arranged on the lower surface of the dielectric 11, and a power supply device 17.

The dielectric 11 is composed of a predetermined insulating material. In particular, polytetrafluoroethylene, polyimide, silicon or nylon is preferably employed as the insulating material from the viewpoint of resistance to high voltage and high insulating property. In addition, aluminum oxide or ceramics may be used, as long as a thickness thereof is several hundred micrometers and a breakdown voltage is several kV. For this reason, the space between the upper electrode 13 and the lower electrode 15 is insulated.

The upper electrode 13 and the lower electrode 15 are composed of a metal material such as copper, aluminum, or iron. The thickness of each electrode can be as thin as several hundred micrometers, such as copper tape, or wires with several tens of micrometers, such as tungsten wire, can be used. Note that the metal used for each electrode can be different. The lower electrode 15 is arranged so as to be shifted in the X-axis direction from the position where the upper electrode 13 is arranged, and thus an electric field is generated between the upper electrode 13 and the lower electrode 15, thereby generating an induced flow that is made to flow in the X-axis direction. Note that the lower electrode 15 is grounded in the present embodiment.

The power supply device 17 is configured by an AC power supply and applies a high AC voltage between the upper electrode 13 and the lower electrode 15. By applying a high AC voltage between the upper electrode 13 and the lower electrode 15, plasma is generated from the upper electrode 13 in the positive X-axis direction. Ionization using plasma generates ions and electrons, which are accelerated by an electric field and collide with neutral particles such as oxygen to generate an induced flow that is made to flow in the positive X-axis direction. The optimum frequency for generating the induced flow ranges from several kHz to 10 several kHz. The plasma can be generated in airflow, but it can be another gas such as argon, or fluid.

The control electrode 5 is an electrode for controlling the flow of the induced flow generated by the plasma actuator 3, and as illustrated in FIGS. 1 to 3, the control electrode 5 is arranged on the upper surface of the dielectric 11 like the upper electrode 13, and is exposed from the upper surface. However, it is not necessary to expose the entire control electrode 5, but at least a portion of the control electrode 5 may be exposed therefrom. In addition, the control electrode 5 may be covered with an insulating film to prevent discharge from the upper electrode 13.

The control electrode 5 is arranged on the upper surface of the dielectric 11 together with the electronic component 7, in the flow direction of the induced flow. In FIG. 3, the lower electrode 15 is arranged so as to shift from the position of the upper electrode 13 in the X-axis direction, and thus an electric field is generated, thereby generating the induced flow that is made to flow in the positive X-axis direction. Further, the control electrode 5 is arranged at the downstream side in the positive X-axis direction, and thus the control electrode 5 is arranged in the flow direction of the induced flow.

Accordingly, in the positive X-axis direction of FIG. 3, the upper electrode 13, the lower electrode 15, and the control electrode 5 are arranged in this order, and the shortest distance between the upper electrode 13 and the lower electrode 15 is shorter than the shortest distance between the upper electrode 13 and the control electrode 5.

A control voltage is applied to the control electrode 5, and the control voltage is a voltage that generates a potential difference, which is capable of attracting an induced flow, between the upper electrode 13 and the control electrode 5. That is, the control voltage is applied to the control electrode 5 such that the potential difference between the upper electrode 13 and the control electrode 5 becomes a potential difference that is capable of attracting the induced flow. For example, the control electrode 5 may be grounded, or a voltage opposite in positive and negative to the voltage of the upper electrode 13 may be applied to the control electrode 5. As a result, an electric field is generated between the upper electrode 13 and the control electrode 5, and ions generated from plasma by using this electric field move in the direction that is attracted to the control electrode 5 and collide with neutral particles, and thus the flow of the induced flow can be controlled in the direction of the control electrode 5.

Specifically, the control electrode 5 is connected to the lower electrode 15 as illustrated in FIG. 3. Since the lower electrode 15 is grounded, the control electrode 5 is also grounded. Since a high AC voltage is applied to the upper electrode 13, a potential difference, which is capable of attracting an induced flow, is generated between the upper electrode 13 and the control electrode 5. For this reason, as illustrated in FIG. 2, the induced flow generated in the upper electrode 13 can be attracted and collected in the direction of the control electrode 5. In particular, since the control electrode 5 in the Y-axis direction is narrower in width than the upper electrode 13, the induced flow generated in the entire lateral width of the upper electrode 13 can be concentrated and collected in the control electrode 5.

The electronic component 7 is, for example, a semiconductor element and, as illustrated in FIGS. 1 to 3, is arranged on the upper surface of the dielectric 11 in the same manner as the upper electrode 13, and is arranged together with the control electrode 5 in the flow direction of the induced flow. In particular, in FIGS. 1 to 3, the electronic component 7 is provided in contact with the upper surface of the control electrode 5. However, the electronic component 7 need not necessarily be provided in contact with the control electrode 5, and may be provided farther from the control electrode 5 at the downstream side of the induced flow from the control electrode 5, for example.

The space between the electronic component 7 and the control electrode 5 may be electrically connected, or insulated through an adhesive or the like. However, when the electronic component 7 and the control electrode 5 are electrically connected with each other, the electronic component 7 has the same potential as the control electrode 5, and thus an electric field is generated between the upper electrode 13 and the electronic component 7, and the electronic component 7 can attract an induced flow. In particular, since the electronic component 7 is high, the induced flow can be attracted not only along the dielectric 11, but also attracted in the Z-axis direction.

When the electronic component 7 is a semiconductor element, such as a logic IC or a power semiconductor, it may be packaged in resin or mounted as a bare chip. At this time, the control electrode 5 may be divided into a plurality of electrode pads for the semiconductor element.

Figure 4:
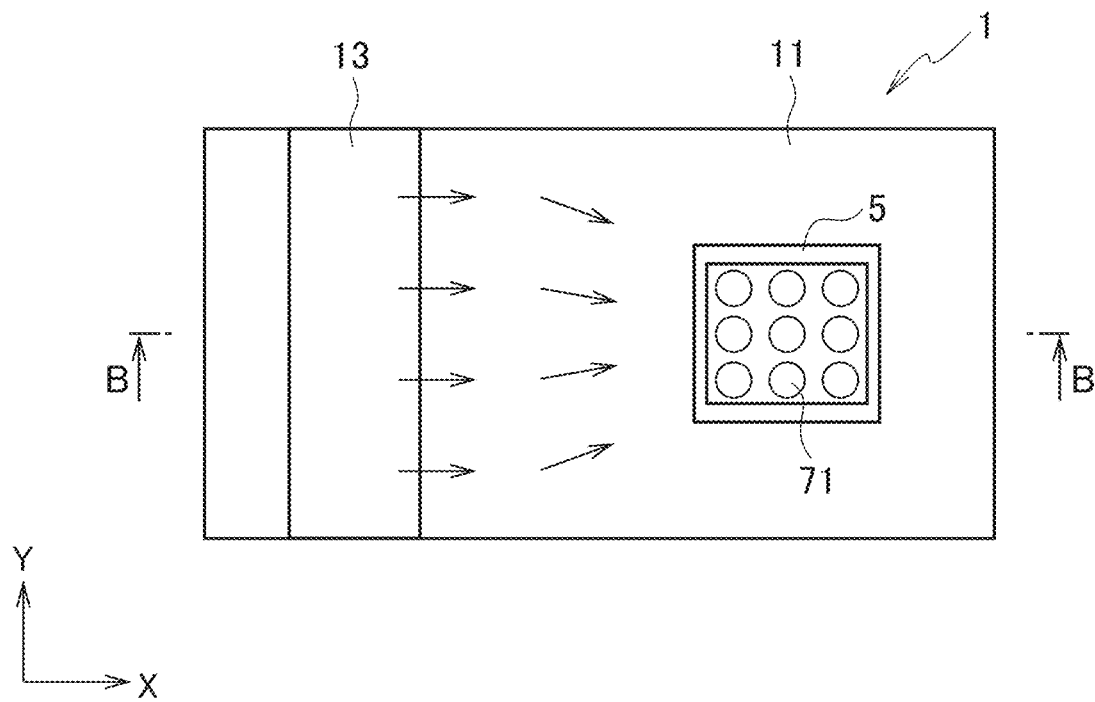
FIG. 4 is a top view illustrating a configuration in which heat sinks are provided as electronic components, in the cooling device according to the first embodiment of the present invention.
Figure 5:
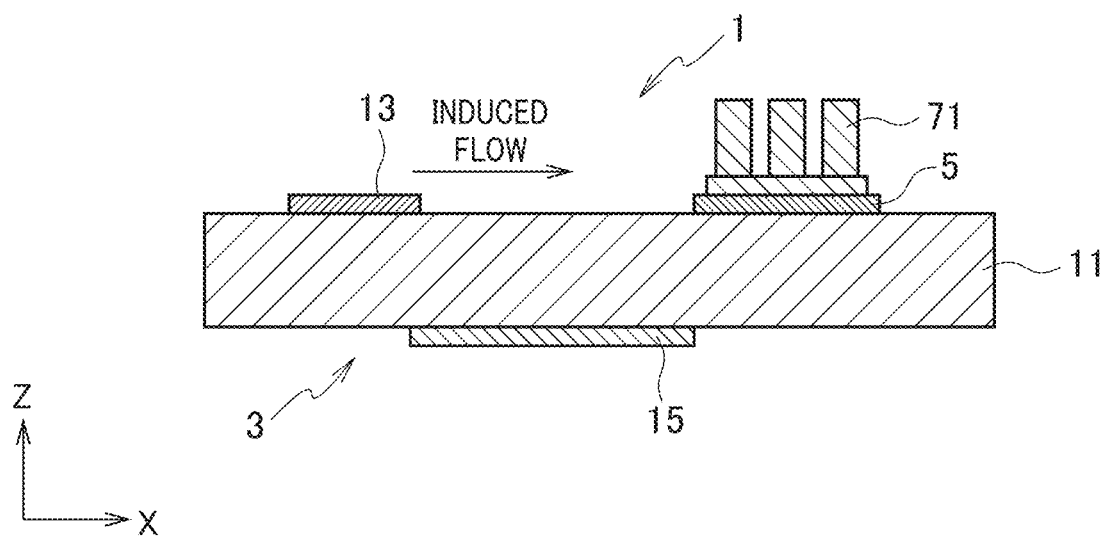
FIG. 5 is a cross-sectional view illustrating a configuration in which the heat sinks are provided as the electronic components, in the cooling device according to the first embodiment of the present invention.

The electronic component 7 may be the heat sinks 71 as illustrated in FIGS. 4 and 5. FIGS. 4 and 5 illustrate the heat sinks 71 having pin fins attached onto the base plate, but the heat sinks 71 may have a base plate only, or have straight fins attached onto the base plate. The material of the heat sinks 71 is generally a metal such as copper or aluminum, but it may be any other metal, or an insulating material such as ceramics.

When the control electrode 5 and the heat sinks 71 are electrically connected with each other, an electric field is generated between the upper electrode 13 and the heat sinks 71, and thus the induced flow can be controlled to flow toward the heat sinks 71. Therefore, the cooling performance can be further improved. In addition, the heat sinks 71 may be provided in contact with the upper surface of the electronic component 7 provided on the upper surface of the control electrode 5. Thus, the heat of the electronic component 7, which is a heating element, can be dissipated through the heat sinks 71.

Figure 6:
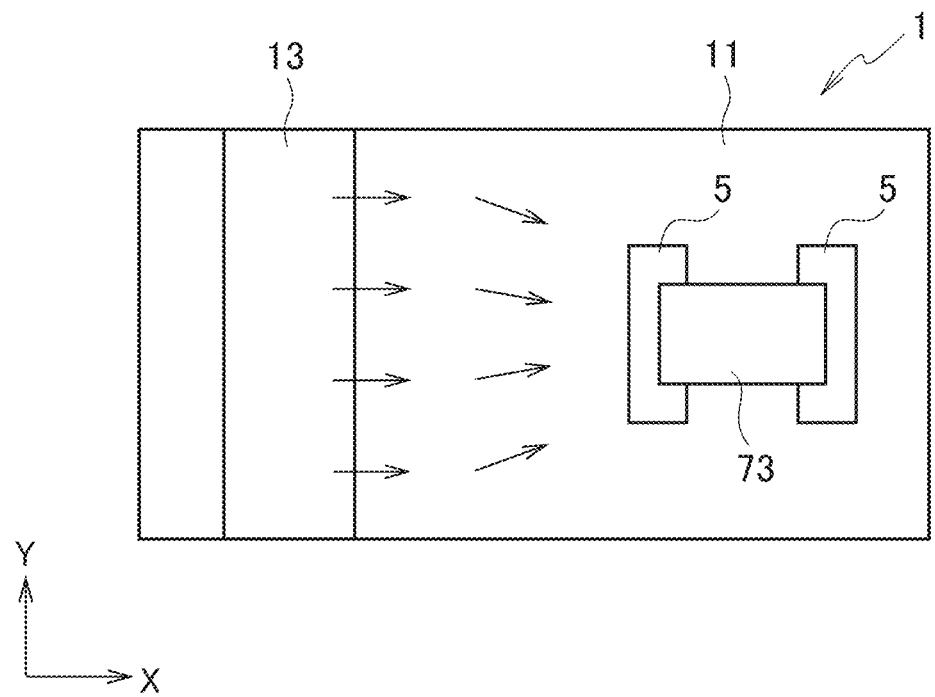
FIG. 6 is a top view illustrating a configuration in which two control electrodes are provided, in the cooling device according to the first embodiment of the present invention.

The electronic component 7 may be a passive component such as a capacitor, a coil, or a resistor. For example, as illustrated in FIG. 6, two control electrodes 5 may be provided to electrically connect a passive component 73 and the control electrode 5, and the two control electrodes 5 may be used as pad electrodes. The two control electrodes 5 may have the same potentials, or the different potentials.

Figure 7:
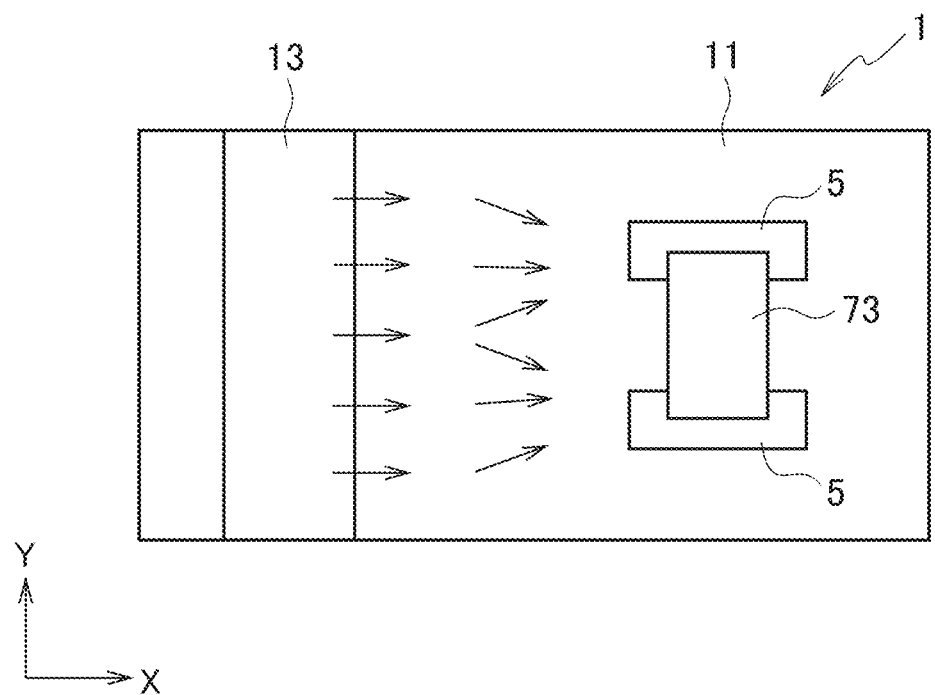
FIG. 7 is a top view illustrating a configuration in which two control electrodes are provided, in the cooling device according to the first embodiment of the present invention.

Further, as illustrated in FIG. 7, the two control electrodes 5 illustrated in FIG. 6 may be arranged by rotating by 90 degrees. In this case, since each of the two control electrodes 5 attracts an induced flow, the induced flow is made to flow in two directions, thereby cooling the passive component 73. When the passive component 73 is electrically connected to the control electrodes 5, an electric field is generated between the upper electrode 13 and the passive component 73, and thus the induced flow can be controlled to flow toward the passive component 73.

When the power supply device 17 is driven in the cooling device 1 that is configured in this manner, a high AC voltage is applied between the upper electrode 13 and the lower electrode 15, plasma is generated from the upper electrode 13 in the positive X-axis direction, and an induced flow is generated by the electric field between the upper electrode 13 and the lower electrode 15. Further, by applying the control voltage to the control electrode 5, the induced flow generated by the plasma actuator 3 can be attracted and collected in the direction of the control electrode 5, as illustrated in FIG. 2. Accordingly, the cooling device 1 according to the present embodiment cools the electronic component 7 by applying to the electronic component 7, an airflow of the induced flow that is collected in the control electrode 5.

Modified Example

Figure 8:
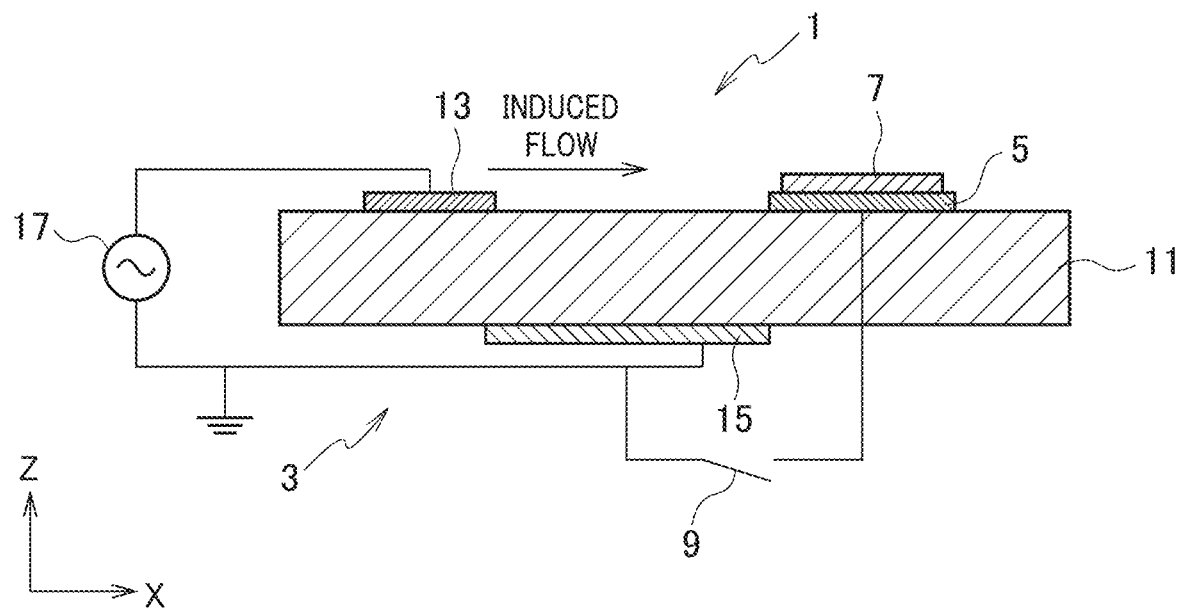
FIG. 8 is a cross-sectional view illustrating a configuration in which a switch for switching ON and OFF the control electrode is provided, in the cooling device according to the first embodiment of the present invention.

As a modified example of the cooling device 1 according to the present embodiment, a switch 9 may be further provided as illustrated in FIG. 8. The switch 9 switches ON and OFF a control voltage applied to the control electrode 5. The switch 9 switches ON and OFF the control voltage, and thus an induced flow can be controlled to cool the electronic component 7 by attracting the induced flow in the direction of the control electrode 5 only when necessary.

Effect of First Embodiment

As described in detail above, in the cooling device 1 according to the present embodiment, the electronic component 7 and the control electrode 5 are arranged in the flow direction of an induced flow, and the voltage applied to the control electrode 5 is a voltage that generates a potential difference, which is capable of attracting the induced flow, between the upper electrode 13 and the control electrode 5. As a result, the induced flow can be attracted in the direction of the control electrode 5, and thus the airflow can be efficiently applied to the electronic component 7. Therefore, the cooling performance of the cooling device 1 can be improved.

In particular, it has been difficult to efficiently cool the electronic component 7 because the flow of the airflow is divided so as to avoid the electronic component 7 even if the airflow is to be applied to the electronic component using a fan or the like. However, since the airflow can be collected in the direction of the control electrode 5 in the present embodiment, it is possible to prevent the flow of the airflow from being divided, thereby applying the airflow to the electronic component 7 more efficiently. Accordingly, the cooling performance of the cooling device 1 can be further improved. Moreover, since dust and organic substances deposited by aging use can be removed by ions and ozone generated by plasma, the performance of the cooling device 1 can be maintained for a long time.

In the cooling device 1 according to the present embodiment, the control electrode 5 is connected to the lower electrode 15. As a result, the potential difference between the upper electrode 13 and the control electrode 5 increases, and thus the induced flow can be strongly attracted. Accordingly, since the airflow can be efficiently applied to the electronic component 7, the cooling performance of the cooling device 1 can be improved.

Further, in the cooling device 1 according to the present embodiment, at least a portion of the control electrode 5 is exposed to the upper surface of the dielectric 11 and arranged thereon. As a result, the electric field between the upper electrode 13 and the control electrode 5 becomes stronger, and thus the induced flow can be attracted more strongly. Accordingly, since the airflow can be efficiently applied to the electronic component 7, the cooling performance of the cooling device 1 can be improved.

Further, in the cooling device 1 according to the present embodiment, the shortest distance between the upper electrode 13 and the lower electrode 15 is shorter than the shortest distance between the upper electrode 13 and the control electrode 5. Thus, the induced flow can be generated between the upper electrode 13 and the lower electrode 15, and the generated induced flow can be attracted and collected in the control electrode 5. Accordingly, since the airflow can be efficiently applied to the electronic component 7, the cooling performance of the cooling device 1 can be improved.

Further, the cooling device 1 according to the present embodiment further includes the switch 9 for switching ON and OFF a voltage applied to the control electrode 5. This makes it possible to switch ON and OFF the control electrode 5 as necessary, and thus the airflow can be efficiently applied to the electronic component 7 only when necessary. Accordingly, since the airflow can be efficiently controlled as above, the cooling performance of the cooling device 1 can be improved.

Further, in the cooling device 1 according to the present embodiment, the electronic component 7 is electrically connected to the control electrode 5. As a result, an electric field is generated between the upper electrode 13 and the electronic component 7, and thus the airflow can be directly applied to the electronic component 7. Accordingly, since the airflow can be efficiently applied to the electronic component 7, the cooling performance of the cooling device 1 can be improved.

Further, in the cooling device 1 according to the present embodiment, the electronic component 7 is provided in contact with the control electrode 5. As a result, since the airflow attracted to the control electrode 5 is directly applied to the electronic component 7, the electronic component 7 can be efficiently cooled. Accordingly, the cooling performance of the cooling device 1 can be improved.

Further, in the cooling device 1 according to the present embodiment, since the electronic component 7 is a semiconductor element, the airflow attracted to the control electrode 5 can be applied to the semiconductor element which is a heating element. Accordingly, the cooling performance of the cooling device 1 can be improved.

Further, in the cooling device 1 according to the present embodiment, since the electronic component 7 is a heat sink, the airflow attracted to the control electrode 5 can be applied to the heat sink for heat dissipation. Accordingly, the cooling performance of the cooling device 1 can be improved.

Further, in the cooling device 1 according to the present embodiment, since the electronic component 7 is a passive component, the airflow attracted to the control electrode 5 can be applied to the passive component which is a heating element. Accordingly, the cooling performance of the cooling device 1 can be improved.

Second Embodiment

A second embodiment of the present invention will be described below with reference to the drawings. The same elements illustrated in the drawings are denoted by the same reference numerals, and overlapping descriptions are not repeated below.

Figure 9:
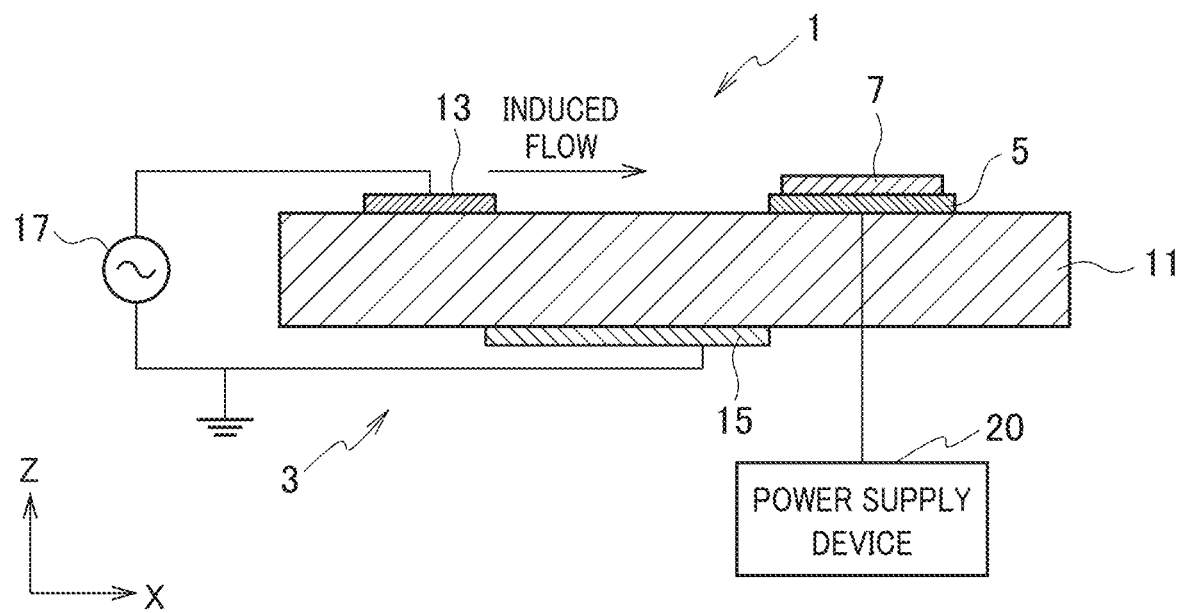
FIG. 9 is a cross-sectional view illustrating a configuration in which the control electrode is connected to a power supply device, in a cooling device according to a second embodiment of the present invention.

FIG. 9 is a cross-sectional view illustrating the structure of the cooling device according to the present embodiment. As illustrated in FIG. 9, the cooling device 1 according to the present embodiment further includes a power supply device 20. In the first embodiment, the control electrode 5 is connected to the lower electrode 15; however, in the present embodiment, the power supply device 20 that is different from the power supply device 17 of the plasma actuator 3 is provided, and a control voltage is applied from the power supply device 20 to the control electrode 5. As in the first embodiment, the control voltage is a voltage that generates a potential difference, which is capable of attracting an induced flow, between the upper electrode 13 and the control electrode 5. However, even if the power supply device 20 is not provided, the voltage supplied to the electronic component 7 may be applied to the control electrode 5. In this case, the cooling device 1 can be configured inexpensively because the power supply device 20 is not provided.

Figure 10:
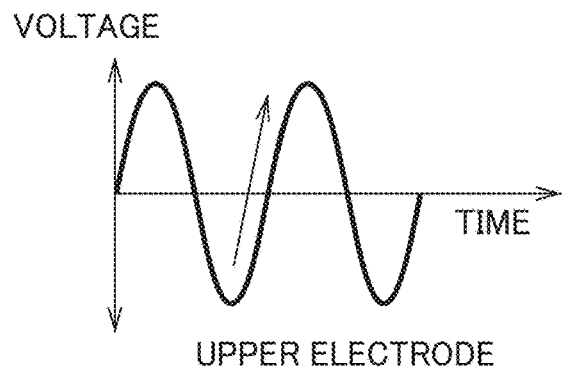
FIG. 10 is a diagram illustrating a time variation of a voltage applied to an upper electrode, in the cooling device according to the second embodiment of the present invention.
Figure 11:
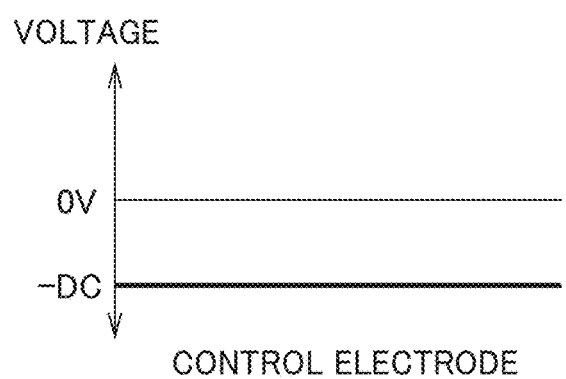
FIG. 11 is a diagram illustrating a voltage applied to the control electrode, in the cooling device according to the second embodiment of the present invention.
Figure 12:
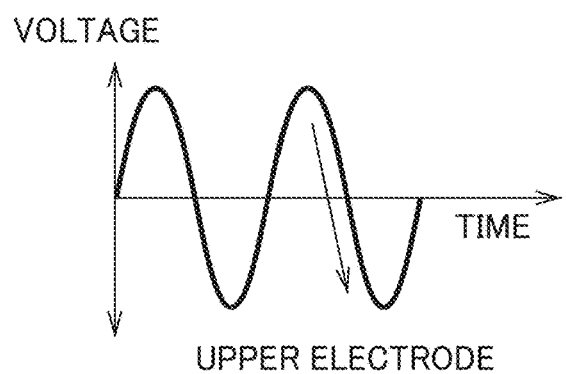
FIG. 12 is a diagram illustrating a time variation of a voltage applied to the upper electrode, in the cooling device according to the second embodiment of the present invention.
Figure 13:
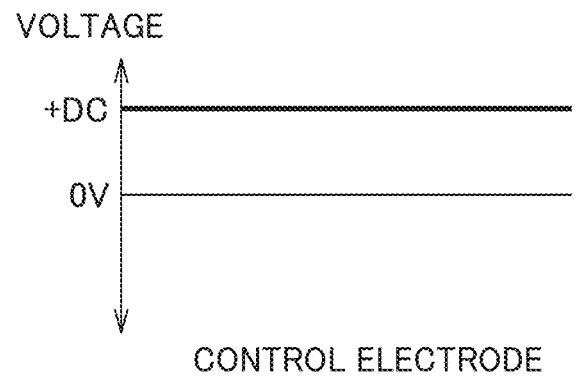
FIG. 13 is a diagram illustrating a voltage applied to the control electrode, in the cooling device according to the second embodiment of the present invention.

In the present embodiment, an AC voltage is applied to the upper electrode 13 from the power supply device 17, and a DC voltage is applied to the control electrode 5 from the power supply device 20. Specifically, when the time variation of the AC voltage (dV/dt) applied to the upper electrode 13 has a positive slope as illustrated in FIG. 10, a negative control voltage is applied to the control electrode 5 as illustrated in FIG. 11. However, when the time variation of the AC voltage applied to the upper electrode 13 has a positive slope, the control electrode 5 may be grounded. Meanwhile, when the time variation of the AC voltage (dV/dt) applied to the upper electrode 13 has a negative slope as illustrated in FIG. 12, a positive control voltage is applied to the control electrode 5 as illustrated in FIG. 13.

Here, ions generated from plasma are different when the time variation of the AC voltage (dV/dt) has an increasing positive slope and a decreasing negative slope. For this reason, in a positive slope, positive ions are attracted to generate an induced flow, while in a negative slope, negative ions are attracted to generate an induced flow. Accordingly, when the voltage of the control electrode 5 is negatively biased in a positive slope and positively biased in a negative slope, the induced flow can be more strongly attracted.

Figure 14:
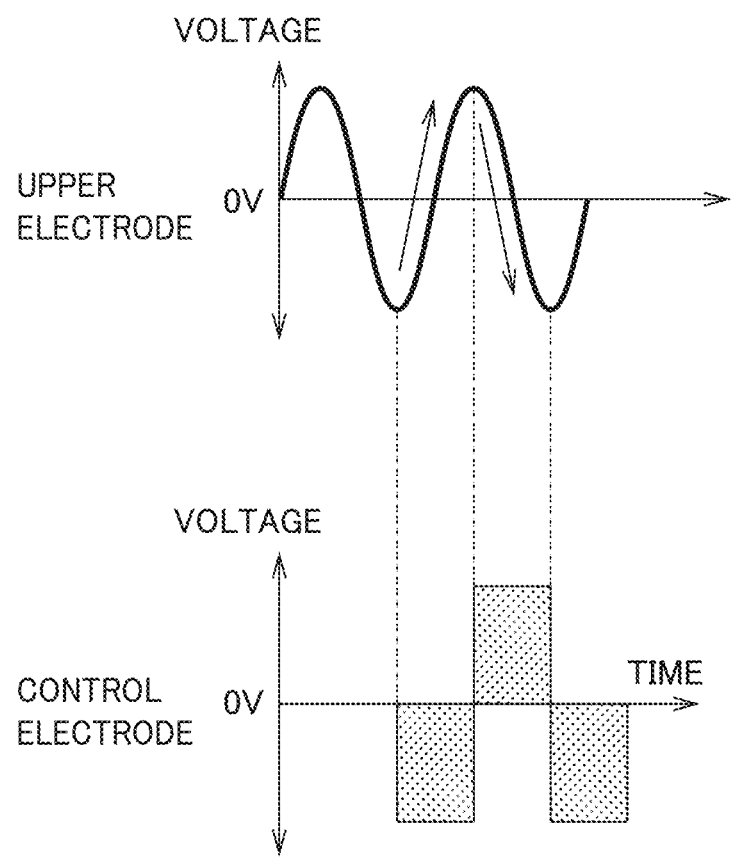
FIG. 14 is a diagram illustrating a time variation of a voltage applied to the upper electrode and the control electrode, in the cooling device according to the second embodiment of the present invention.

Thus, as illustrated in FIG. 14, when an AC voltage is applied from the power supply device 17 between the upper electrode 13 and the lower electrode 15, the power supply device 20 switches between positive and negative DC voltages applied to the control electrode 5 according to the time variation of the AC voltage (dV/dt). That is, when the time variation of the AC voltage of the upper electrode 13 has a positive slope, a negative DC voltage is applied to the control electrode 5, and when the time variation of the AC voltage is switched to a negative slope, a positive DC voltage is applied to the control electrode 5.

Effect of Second Embodiment

As described in detail above, in the cooling device 1 according to the present embodiment, when the time variation of the voltage of the upper electrode 13 has a positive slope, the control electrode 5 is grounded or a negative voltage is applied to the control electrode 5, and when the time variation of the voltage of the upper electrode 13 has a negative slope, a positive voltage is applied to the control electrode 5. As a result, ions generated from the plasma can be attracted, thereby making it possible to control an induced flow so as to be attracted to the control electrode 5. Accordingly, since the airflow can be efficiently applied to the electronic component 7, the cooling performance of the cooling device 1 can be improved.

Third Embodiment

A third embodiment of the present invention will be described below with reference to the drawings. The same elements illustrated in the drawings are denoted by the same reference numerals, and overlapping descriptions are not repeated below.

Figure 15:
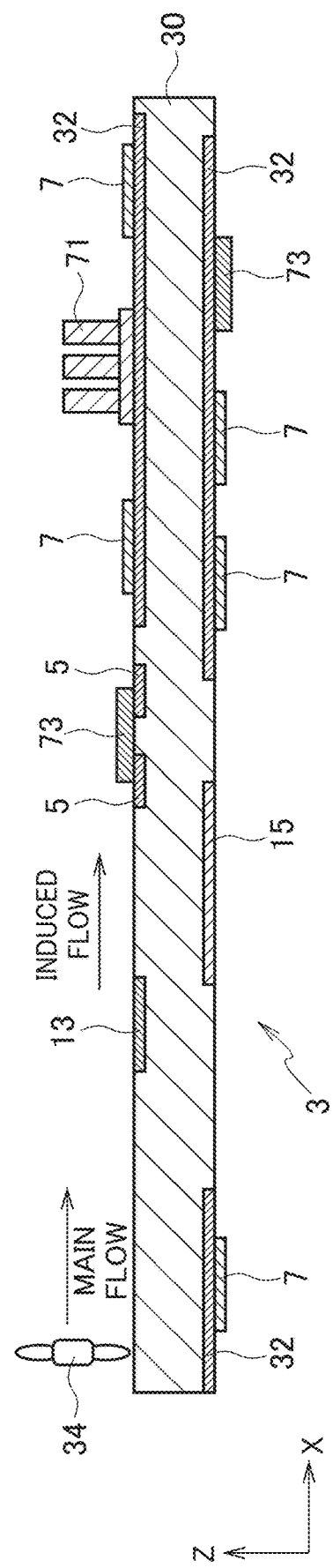
FIG. 15 is a cross-sectional view illustrating a configuration in which a dielectric of a plasma actuator is a printed circuit board, in a cooling device according to a third embodiment of the present invention.

FIG. 15 is a cross-sectional view illustrating the structure of the cooling device according to the present embodiment. As illustrated in FIG. 15, the cooling device 1 according to the present embodiment differs from the first embodiment in that an dielectric is constituted by a printed circuit board 30.

The upper electrode 13 and the control electrodes 5 are arranged on the upper surface of the printed circuit board 30, and the passive component 73 is provided in contact with the control electrodes 5. Meanwhile, the lower electrode 15 is arranged on the lower surface of the printed circuit board 30. An electronic circuit having a wiring pattern is formed on the upper surface and lower surface of the printed circuit board 30. Pad electrodes (fourth electrodes) 32 are formed on the electronic circuit, and a plurality of electronic components 7 are electrically connected to the pad electrodes 32. The electronic components 7 include the heat sinks 71 and the passive component 73. By forming the pad electrodes 32 widely on the printed circuit board 30, the pad electrodes 32 can be used as an electromagnetic shield to suppress the spread of noise.

When an electronic circuit board made of glass epoxy or the like, or a flexible printed circuit board made of polyimide or the like is used for the printed circuit board 30, the plasma actuator 3 can be inexpensively formed on a printed circuit board having high precision in units of mm and μm with multilayer wiring. Moreover, by using an electronic circuit board made of glass epoxy or the like, it is possible to provide the cooling device 1 having high strength and high reliability by making use of the property of such an electronic circuit board. Furthermore, when using a flexible printed circuit board, the plasma actuator 3 can be formed on a printed circuit board that is thin and bendable.

A main flow generator 34 such as a fan is provided on the upper surface of the printed circuit board 30. As illustrated in FIG. 15, the main flow generator 34 generates a main flow from one end of the printed circuit board 30 toward the flow direction of an induced flow. As a result, the electronic components 7 arranged on the upper surface of the printed circuit board 30 can be cooled by using not only the induced flow, but also the main flow.

However, since a boundary layer was generated due to friction between the main flow and the printed circuit board 30 and the boundary layer gradually developed, the main flow was separated from the printed circuit board 30. Accordingly, the heat transfer between the printed circuit board 30 and the airflow layer decreased at a more downstream position of the printed circuit board 30 in the X-axis direction.

However, in the present embodiment, the induced flow is generated by the plasma actuator 3 and the induced flow is attracted by using the control electrode 5, and thus it is possible to suppress the separation of the main flow from the printed circuit board 30. Accordingly, the heat transfer between the printed circuit board 30 and the airflow layer is improved, and thus the cooling performance of the cooling device 1 can be improved.

In this case, when the electronic components 7 are divided into strong electric components and weak electric components, the strong electric components are arranged on the upper surface of the printed circuit board 30, and the weak electric components are arranged on the lower surface thereof, the strong electric components having large heat generation can be cooled more efficiently using both the main flow and the induced flow.

Figure 16:
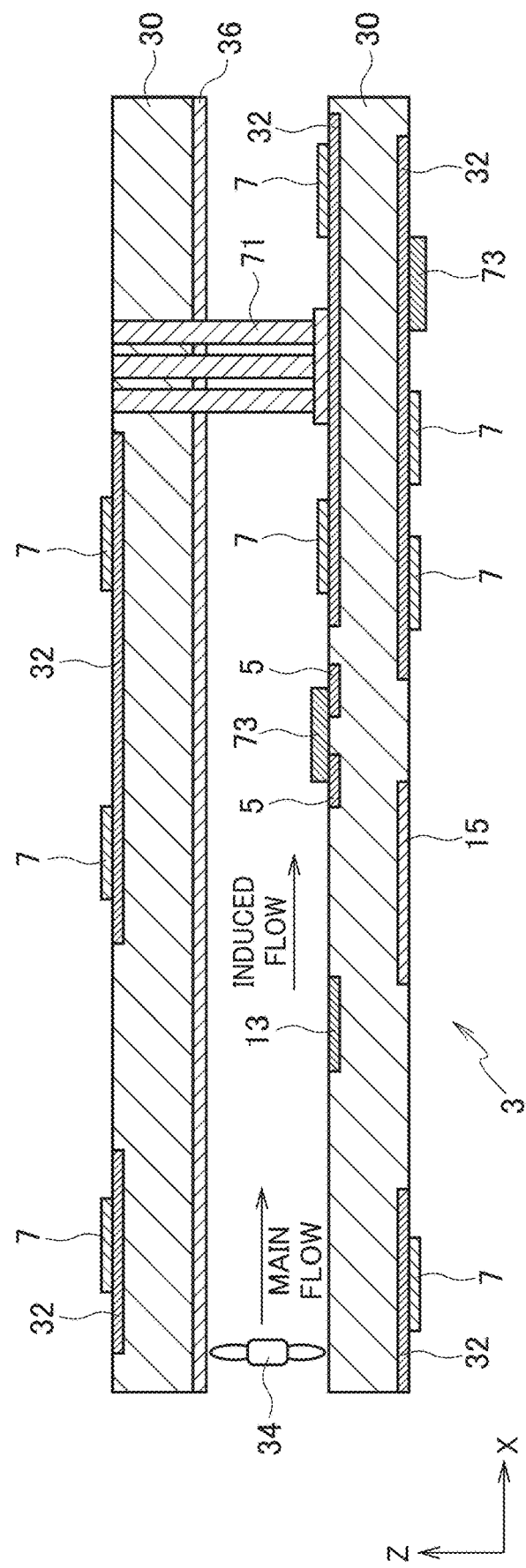
FIG. 16 is a cross-sectional view illustrating a configuration in which a main flow generator is provided between two printed circuit boards, in the cooling device according to the third embodiment of the present invention.

As illustrated in FIG. 16, two printed circuit boards 30 may be stacked in the up-down direction, and the main flow generator 34 may be arranged therebetween. At this time, a base plate 36 for the heat sinks 71 may be formed on the lower surface of the upper printed circuit board 30. By arranging the main flow generator 34 between the two printed circuit boards 30 in this manner, the main flow is made to flow in the duct, and thus the airflow can be reliably applied to the electronic components 7 on the printed circuit board 30. Further, since the base plate 36 is formed, the cooling of the electronic components 7 and the cooling of the heat sinks 71 can be made compatible. Accordingly, the cooling performance of the cooling device 1 can be improved, and the cooling device 1 can be reduced in size.

In FIGS. 15 and 16, only one plasma actuator 3 is formed on the printed circuit board 30, but a plurality of plasma actuators 3 may be provided at positions where cooling is desired. The main flow generator 34 may be provided in the cooling device 1 of the first and second embodiments as well as the present embodiment.

Modified Example

Figure 17:
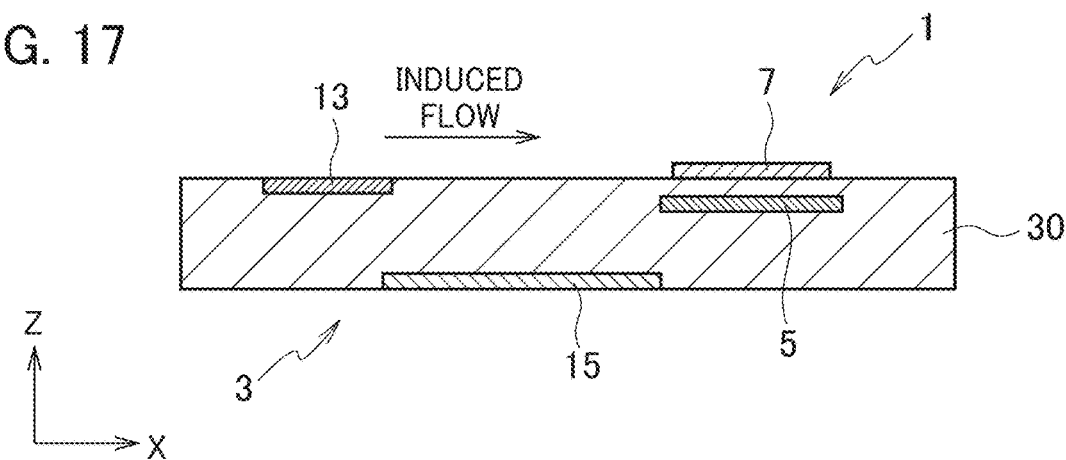
FIG. 17 is a cross-sectional view illustrating a configuration in which the control electrode is embedded in a printed circuit board, in the cooling device according to the third embodiment of the present invention.

As a modified example of the cooling device 1 according to the present embodiment, the control electrode 5 may be embedded in the printed circuit board 30 as illustrated in FIG. 17. For example, four wiring layers can be formed for each layer in the printed circuit board 30, the control electrode 5 can be easily formed inside the printed circuit board 30. Note that the control electrode 5 may be embedded in the dielectric 11. In this case, a method can be used in which the control electrode 5 is fixed to allow the liquid dielectric to flow and solidify the liquid dielectric, or a method can be used in which the control electrode 5 is inserted into the dielectric.

By embedding the control electrode 5 in the printed circuit board 30 in this manner, the control electrode 5 is insulatively protected by the printed circuit board 30, and thus an insulation breakdown can be suppressed between the upper electrode 13 and the control electrode 5. Accordingly, this makes it possible to improve the reliability of the cooling device 1. In addition, it is possible to prevent the control electrode 5 from being exposed to air and oxidized.

Figure 18:
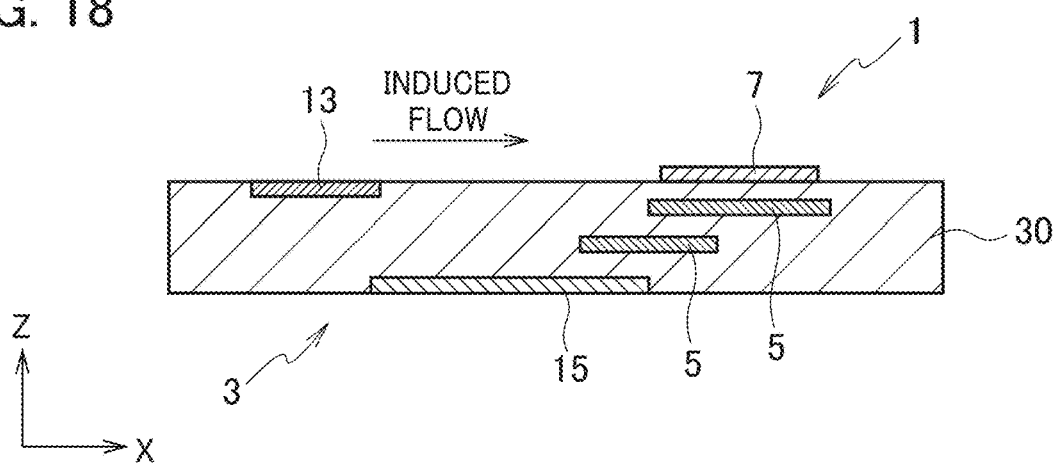
FIG. 18 is a cross-sectional view illustrating a configuration in which the control electrodes are embedded in the printed circuit board, in the cooling device according to the third embodiment of the present invention.

Further, as illustrated in FIG. 18, a plurality of control electrodes 5 may be provided such that the control electrode 5 at the side close to the upper electrode 13 is embedded in a deep position, and the control electrode 5 at the side far from the upper electrode 13 is embedded in a shallow position. Since the control electrode 5 at the side close to the upper electrode 13 is embedded in a deep position, an insulation breakdown can be suppressed therebetween. Meanwhile, since the control electrode 5 at the side far from the upper electrode 13 is embedded in a shallow position, the electric field between the control electrode 5 and the upper electrode 13 can be strengthened.

Figure 19:
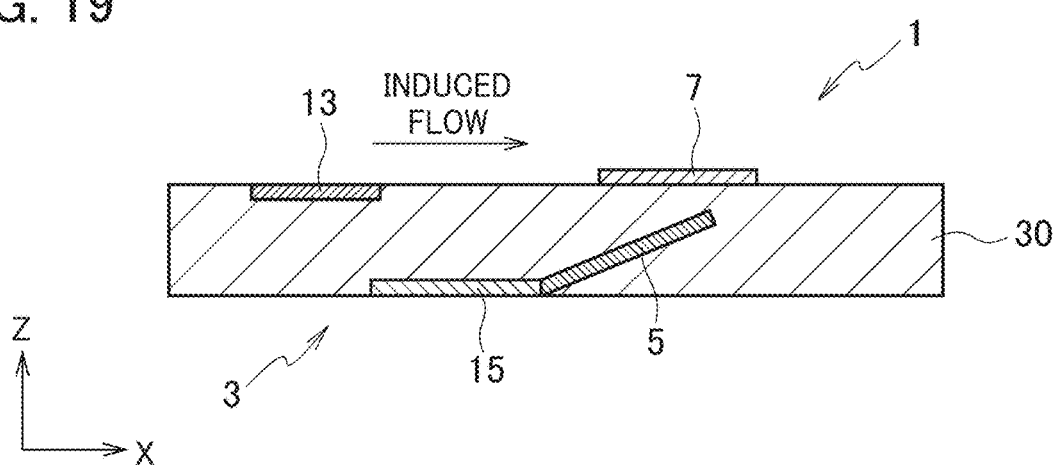
FIG. 19 is a cross-sectional view illustrating a configuration in which the control electrode is embedded in the printed circuit board, in the cooling device according to the third embodiment of the present invention.

Further, as illustrated in FIG. 19, the control electrode 5 may be embedded in the printed circuit board 30, the control electrode 5 may be connected to the lower electrode 15, and the upper surface of the control electrode 5 may be arranged so as to be oblique toward the upper electrode 13. When the control electrode 5 is arranged horizontally, the distance from the upper electrode 13 is different between the end portion of the control electrode 5 close to the upper electrode 13 and the end portion of the control electrode 5 far from the upper electrode 13, and this causes a difference in the electric field. In contrast, as illustrated in FIG. 19, when the upper surface of the control electrode 5 is arranged so as to be oblique toward the upper electrode 13, the electric field can be made nearly uniform between the end portion of the control electrode 5 close to the upper electrode 13 and the end portion of the control electrode 5 far from the upper electrode 13. Accordingly, the control electrode 5 can secure an insulating distance between the control electrode 5 and the upper electrode 13, and the electric field can be uniformly strengthened on the upper surface of the control electrode 5.

Effect of Third Embodiment

As described above in detail, in the cooling device 1 according to the present embodiment, since the dielectric is constituted by the printed circuit board 30, each electrode can be formed with high precision, and thus a withstand voltage can be easily secured. Accordingly, the reliability of the cooling device 1 can be secured, and the mass-productivity thereof can be improved.

Further, in the cooling device 1 according to the present embodiment, the control electrode 5 is embedded in the printed circuit board 30. As a result, an insulation breakdown between the upper electrode 13 and the control electrode 5 can be suppressed, thereby improving the reliability of the cooling device 1.

Further, in the cooling device 1 according to the present embodiment, since an electronic circuit is formed on the printed circuit board 30, each electronic component formed on the electronic circuit can be cooled using the induced flow generated by the plasma actuator 3.

Further, in the cooling device 1 according to the present embodiment, a strong electric component is arranged on the surface of the printed circuit board 30 where the upper electrode 13 is arranged. As a result, the strong electric component having large heat generation can be cooled using the induced flow, and thus the cooling performance of the cooling device 1 can be improved.

Further, in the cooling device 1 according to the present embodiment, the pad electrode 32 to which the electronic component 7 is connected is formed in the electronic circuit, and thus noise generated from the electronic circuit can be shielded.

Further, the cooling device 1 according to the present embodiment is further provided with the main flow generator 34 that generates a main flow in the flow direction of an induced flow. As a result, since the main flow generated from the main flow generator 34 can be controlled by using the control electrode 5, the cooling performance of the cooling device 1 can be further improved.

Note that the embodiments described above are an example of the present invention. Accordingly, the present invention is not limited to the embodiments described above. Needless to say, various changes can be made to embodiments other than those described above according to design or the like without departing from the technical ideas of the present invention.

LIST OF REFERENCE NUMERALS

1: Cooling device
3: Plasma actuator
5: Control electrode (third electrode)
7. Electronic component
11. Dielectric
13: Upper electrode (first electrode)
15: Lower electrode (second electrode)
17, 20: Power supply device
30: Printed circuit board
32: Pad electrode (fourth electrode)
34: Main flow generator
36: Base plate
71: Heat sink
73: Passive component

The invention claimed is:

1. A cooling device comprising:
   a plasma actuator generating an induced flow, including:
      a dielectric;
      a first electrode arranged on a first surface of the dielectric;
      a second electrode arranged on an other second surface of the dielectric; and
      a power supply device configured to apply a voltage between the first electrode and the second electrode, and
   an electronic component arranged on the first surface in a flow direction of the induced flow, wherein
      a third electrode is arranged on the first surface of the dielectric together with the electronic component, the electronic component is stacked on the third electrode such that the electronic component is electrically connected to the third electrode, and
      a voltage applied to the third electrode is a voltage that generates a potential difference, which is capable of attracting the induced flow, between the first electrode and the third electrode.

2. The cooling device according to claim 1, wherein the third electrode is connected to the second electrode.

3. The cooling device according to claim 1, wherein the third electrode is grounded, or a negative voltage is applied to the third electrode when a time variation of a voltage of the first electrode has a positive slope, and a positive voltage is applied to the third electrode when the time variation of the voltage of the first electrode has a negative slope.

4. The cooling device according to claim 1, wherein the third electrode is arranged such that at least a portion of the third electrode is exposed on the first surface of the dielectric.

5. The cooling device according to claim 1, wherein a shortest distance between the first electrode and the second electrode is shorter than a shortest distance between the first electrode and the third electrode.

6. The cooling device according to claim 1, further comprising:
   a switch that switches ON and OFF a voltage applied to the third electrode.

7. The cooling device according to claim 1, wherein the electronic component is provided in contact with the third electrode.

8. The cooling device according to claim 1, wherein the electronic component is a semiconductor element.

9. The cooling device according to claim 1, wherein the electronic component is a heat sink.

10. The cooling device according to claim 1, wherein the electronic component is a passive component.

11. The cooling device according to claim 1, wherein the dielectric is a printed circuit board.

12. The cooling device according to claim 11, wherein the third electrode is embedded in the printed circuit board.

13. The cooling device according to claim 11, wherein an electronic circuit is formed on the printed circuit board.

14. The cooling device according to claim 13, wherein a second electronic component generating more heat than the electronic component is arranged on the first surface of the printed circuit board, the printed circuit board including the first electrode and the electronic circuit formed on the first surface.

15. The cooling device according to claim 13, further comprising a pad electrode formed in the electronic circuit.

16. The cooling device according to claim 1, further comprising:

a main flow generator that generates a main flow in the flow direction of the induce flow.

17. The cooling device according to claim 1, wherein the second surface is opposite to the first surface.

* * * * *